United States Patent
Miyazaki

(10) Patent No.: US 7,968,917 B2
(45) Date of Patent: Jun. 28, 2011

(54) SEMICONDUCTOR MEMORY DEVICE

(75) Inventor: Satoshi Miyazaki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 116 days.

(21) Appl. No.: 12/564,068

(22) Filed: Sep. 22, 2009

(65) Prior Publication Data
US 2010/0078685 A1  Apr. 1, 2010

(30) Foreign Application Priority Data
Sep. 29, 2008  (JP) ................................ 2008-249859

(51) Int. Cl.
*H01L 27/10* (2006.01)
(52) U.S. Cl. ................. 257/207; 257/208; 257/E29.166
(58) Field of Classification Search .................. 257/207, 257/208, E29.166
See application file for complete search history.

(56) References Cited

U.S. PATENT DOCUMENTS

| | | | |
|---|---|---|---|
| 2009/0039918 A1* | 2/2009 | Madurawe | 326/41 |
| 2009/0194768 A1* | 8/2009 | Leedy | 257/48 |
| 2009/0243650 A1* | 10/2009 | Madurawe | 326/38 |

FOREIGN PATENT DOCUMENTS
JP  2008-071865  3/2008
* cited by examiner

*Primary Examiner* — David S Blum
(74) *Attorney, Agent, or Firm* — Volentine & Whitt, PLLC

(57) ABSTRACT

There is provided a semiconductor memory device including: a first wiring layer; a second wiring layer; a third wiring layer; a memory array region; a first gate array region being formed at a region at which the first wiring layer, the second wiring layer and the third wiring layer can be used in wiring of the plural unit cells; and a second gate array region being formed at a region at which two wiring layers that are the first wiring layer and the second wiring layer can be used in wiring of the plural memory cells, and the plural unit cells are arrayed so as to be separated at an interval needed for placement, by using the first wiring layer, of wiring that should be placed by using the third wiring layer.

6 Claims, 8 Drawing Sheets

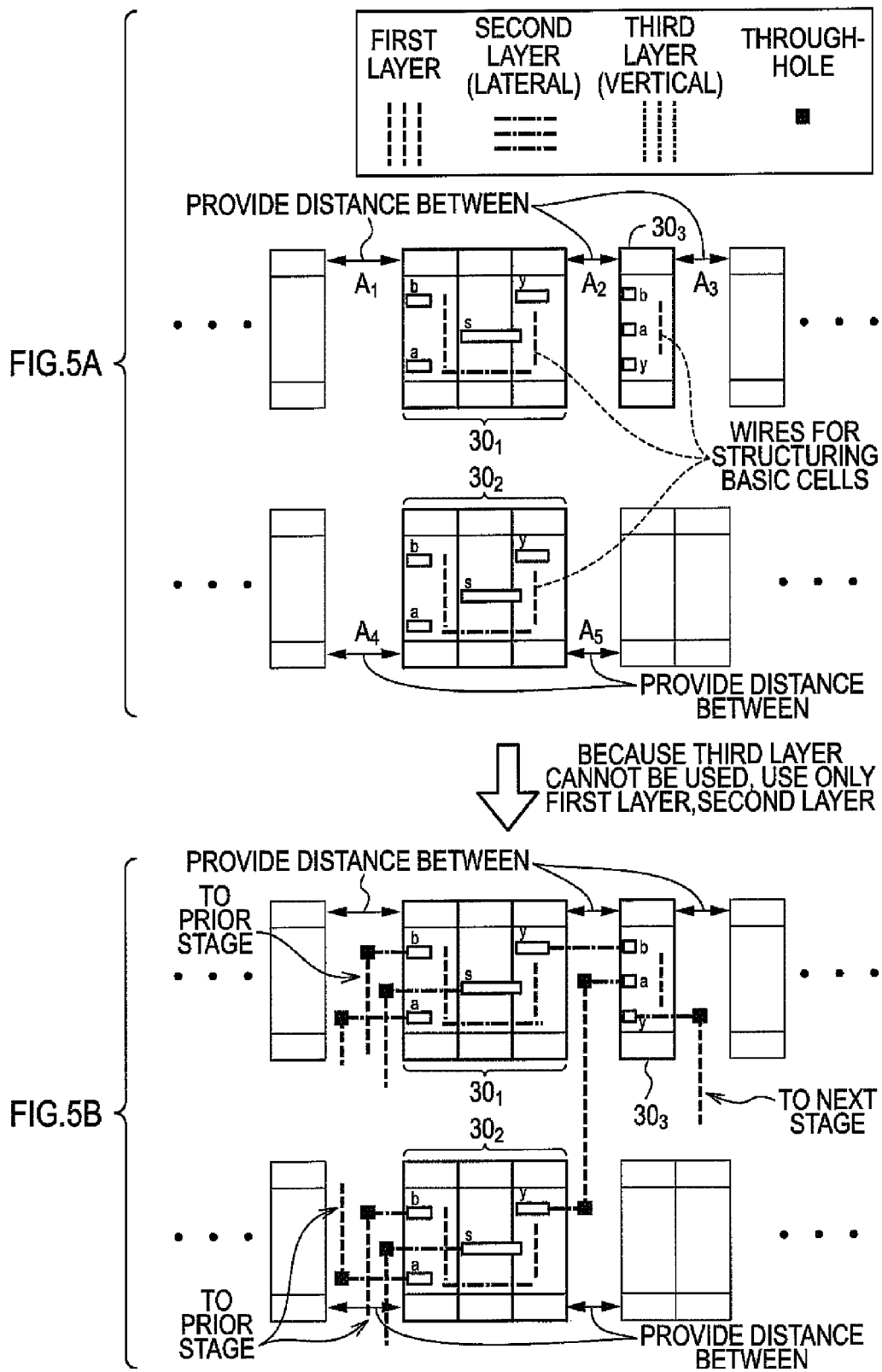

SEMICONDUCTOR MEMORY DEVICE

CROSS-REFERENCE TO RELATED APPLICATION

This application is based on and claims priority under 35 USC 119 from Japanese Patent Application No. 2008-249859 filed on Sep. 29, 2008, the disclosure of which is incorporated by reference herein.

BACKGROUND

1. Technical Field

The present invention relates to a semiconductor memory device, and in particular, to a semiconductor memory device at which gate arrays are also provided (a gate arrays mixed-loaded semiconductor memory) and that is realized by three layers of wiring.

2. Related Art

Conventionally, when mixed-loading gate arrays at a semiconductor memory device of three layers of wiring (e.g., a first layer of vertical wiring, a second layer of lateral wiring, and a third layer of vertical wiring), there is generally used a method that disposes gate array regions at a position at which all of the wiring layers can be utilized, and circuit wiring is carried out by using only that region.

From Japanese Patent Application Laid-Open (JP-A) No. 2008-71865, there is known a method that disposes basic cells below the power supply wiring so as to effectively utilize the region below the power supply wiring. This JP-A No. 2008-71865 discloses a layout method in which, by disposing the basic cells below the power supply wiring at the time of repairing circuits, the circuits can be changed without changing the chip size or the lower layer portion.

There is proposed a device (see JP-A No. 2008-71865) that, in order to shorten overall processing time, carries out regular processings by hardware and carries out irregular processings by software.

However, in the method of disposing the gate array regions at a position at which all of the wiring layers can be utilized, the gate array regions must be enlarged in accordance with the circuit scale, which leads to an increase in the chip surface area.

Further, in the technique of JP-A No. 2008-71865, the basic cells are disposed beneath the power supply wiring, and the region below the power supply wiring is utilized effectively. However, the basic cells that are disposed here are limited to dummy basic cells that are used in circuit repair from the contact hole process and thereafter. Further, when the basic cells are disposed beneath the power supply wiring and are used as the gate array regions, at this region, one layer among the three wiring layers is occupied by the power supply wiring, and therefore, there are two wiring layers that can be used for the wiring of the circuits. Accordingly, violations (the impossibility of circuit wiring) due to congestion of wires, and the like, arise, and this region cannot be used as usual gate array regions.

SUMMARY

The present invention has been proposed in order to overcome the above-described problems, and an object thereof is to provide a semiconductor memory device in which, without forming numerous wiring layers, gate arrays are disposed at a region at which a third wiring layer cannot be utilized in the wiring of unit cells or basic cells, such that this region can be utilized effectively.

An aspect of the present invention provides a semiconductor memory device including:
a first wiring layer for carrying out wiring in at least a first direction;
a second wiring layer that is layered on the first wiring layer and is for carrying out wiring in a second direction intersecting the first direction;
a third wiring layer that is layered on the second wiring layer and is for carrying out wiring in the first direction;
a memory array region at which a plurality of memory cells are formed so as to be arrayed at the first wiring layer, the memory array region being formed at a region at which the first wiring layer, the second wiring layer and the third wiring layer can be used in wiring of the plurality of memory cells;
a first gate array region at which a plurality of unit cells are formed so as to be arrayed at the first wiring layer, the first gate array region being formed at a region at which the first wiring layer, the second wiring layer and the third wiring layer can be used in wiring of the plurality of unit cells; and
a second gate array region at which a plurality of unit cells are formed so as to be arrayed at the first wiring layer, the second gate array region being formed at a region at which two wiring layers that are the first wiring layer and the second wiring layer can be used in wiring of the plurality of memory cells, and the plurality of unit cells are arrayed so as to be separated at an interval needed for placement, by using the first wiring layer, of wiring that should be placed by using the third wiring layer.

In accordance with this structure, without forming numerous wiring layers, gate arrays are disposed at a region at which the third wiring layer cannot be utilized in wiring, such that this region can be utilized effectively.

Another aspect of the present invention provides a semiconductor memory device including:
a first wiring layer for carrying out wiring in at least a first direction;
a second wiring layer that is layered on the first wiring layer and is for carrying out wiring in a second direction intersecting the first direction;
a third wiring layer that is layered on the second wiring layer and is for carrying out wiring in the first direction;
a memory array region at which a plurality of memory cells are formed so as to be arrayed at the first wiring layer, the memory array region being formed at a region at which the first wiring layer, the second wiring layer and the third wiring layer can be used in wiring of the plurality of memory cells;
a first gate array region at which a plurality of basic cells that are structured by a plurality of unit cells are formed so as to be arrayed at the first wiring layer, the first gate array region being formed at a region at which the first wiring layer, the second wiring layer and the third wiring layer can be used in wiring of the plurality of basic cells and the unit cells that structure the plurality of basic cells; and
a second gate array region at which a plurality of basic cells that are structured by a plurality of unit cells are formed so as to be arrayed at the first wiring layer, the second gate array region being formed at a region at which two wiring layers that are the first wiring layer and the second wiring layer can be used in wiring of the plurality of basic cells and the unit cells that structure the plurality of basic cells, and the plurality of basic cells are arrayed so as to be separated at an interval needed for placement, by using the first wiring layer, of wiring that should be placed by using the third wiring layer.

In accordance with this structure, without forming numerous wiring layers, gate arrays are disposed at a region at which the third wiring layer cannot be utilized in wiring, such that this region can be utilized effectively.

A power supply wiring region, at which is disposed power supply wiring that supplies power supply voltage to the memory cells, may be formed at the third wiring layer, and the second gate array region may be formed at a region below the power supply wiring region.

In accordance with this structure, without forming numerous wiring layers, the region beneath the power supply wiring region can be used for gate array regions, such that this region can be utilized effectively.

Or, a first power supply wiring region, at which is disposed first power supply wiring that supplies first power supply voltage to the memory cells, and a second power supply wiring region, at which is disposed second power supply wiring that supplies second power supply voltage that is higher than ground voltage at times of writing the memory cells and supplies ground voltage at times of reading, may be formed at the third wiring layer, the second gate array region is formed below the second power supply wiring region, and a circuit, that does not operate when the second power supply wiring supplies the second power supply voltage and operates when the second power supply wiring supplies ground voltage, may be formed at the second gate array region.

In accordance with this structure, malfunctioning due to effects of power supply noise is avoided, and the region beneath the second power supply wiring region can be utilized effectively.

As described above, in accordance with the present invention, there is the effect that, without forming numerous wiring layers, gate arrays are disposed at a region at which the third wiring layer cannot be utilized in wiring of unit cells and basic cells, such that this region can be utilized effectively.

BRIEF DESCRIPTION OF THE DRAWINGS

Exemplary embodiments of the present invention will be described in detail based on the following figures, wherein:

FIG. 5A and FIG. 5B are drawings showing an example of placement of basic cells when the circuit shown in FIG. 3 is formed at a second gate array region;

DETAILED DESCRIPTION

Preferred exemplary embodiments of the present invention will be described in detail hereinafter with reference to the drawings.

First Exemplary Embodiment

Figure 1:
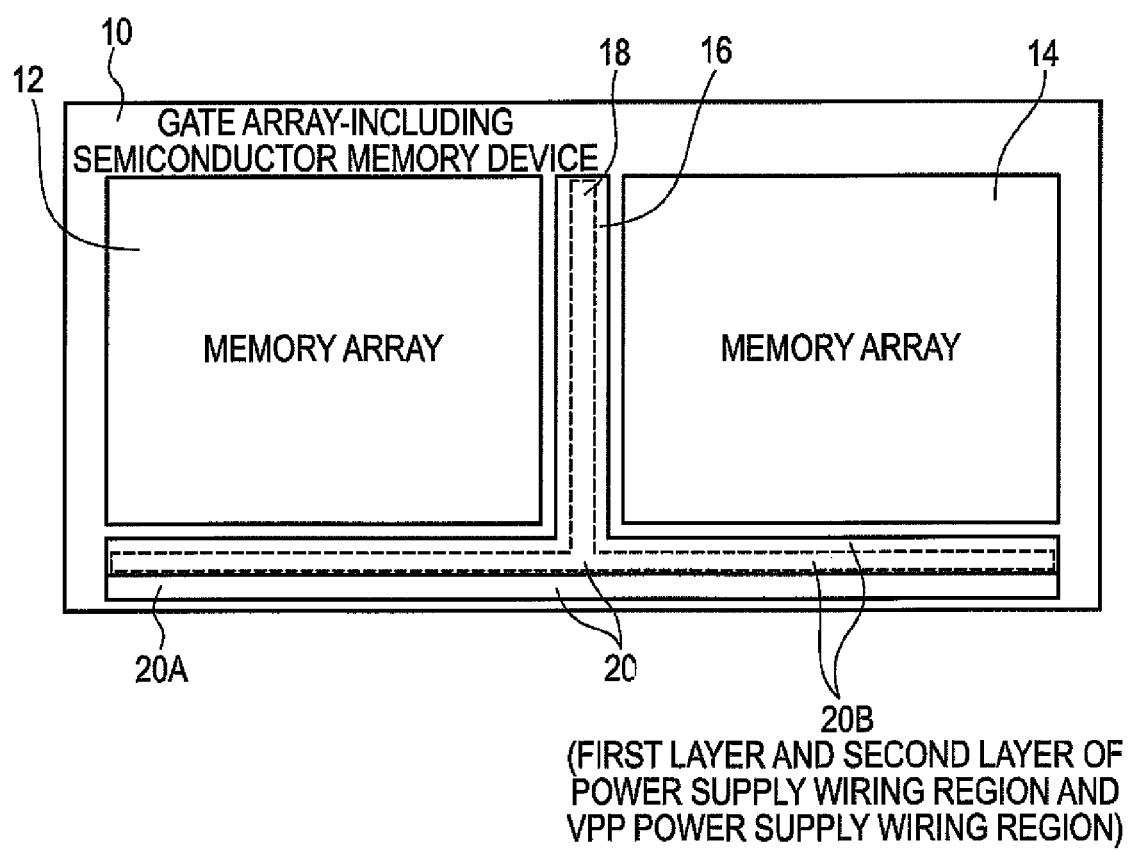
FIG. 1 is a structural drawing of a gate array mixed-loaded semiconductor memory device of a first exemplary embodiment.

FIG. 1 is a structural drawing of a gate array mixed-loaded semiconductor memory device 10 of an exemplary embodiment of the present invention.

Two memory array regions 12, 14 at which memory cells are arrayed, a power supply wiring region (VDD, VSS) 16, a VPP power supply wiring region 18, and a gate array region 20 at which plural basic cells 30 (refer to FIG. 2 as well) are arrayed, are disposed at the gate array mixed-loaded semiconductor memory device 10. The gate array mixed-loaded semiconductor memory device 10 is structured by three wiring layers (a cross-sectional view thereof is omitted), and, in the present exemplary embodiment, among the three wiring layers, the first layer is used as a wiring layer for vertical wiring, the second layer is used as a wiring layer for lateral wiring, and the third layer is used as a wiring layer for vertical wiring. Note that, although the first layer is a wiring layer for vertical wiring, in connecting within a unit cell 40 as will be described later, there are also cases in which lateral wiring is disposed at the first wiring layer.

Hereinafter, description will be given of, among the three wiring layers, the third wiring layer being the topmost wiring layer, the first wiring layer being the bottommost wiring layer, and the second wiring layer being the wiring layer provided between the first and third wiring layers.

Note that the basic cell 30 is structured from one or plural unit cells 40 (refer as well to FIG. 4A, FIG. 4B, FIG. 5A and FIG. 5B), and is a basic function cell that realizes the basic function of a NAND or an inverter or the like. Although illustration of the unit cells 40 is omitted here, the unit cells 40 are for PMOS transistors and NMOS transistors to be connected via polysilicon. The PMOS transistor may be structured by an N-type well, a P-type implantation layer, an active region, a P-type substrate and the like. The NMOS transistor may be structured by a P-type implantation layer, an active region, an N-type substrate, and the like.

The gate array region 20 is structured from a first gate array region 20A at which all three of the wiring layers can be utilized, and second gate array regions 20B that are formed at the regions below the power supply wiring region 16 and the VPP power supply wiring region 18 and at which the first and second wiring layers can be used.

Figure 2:
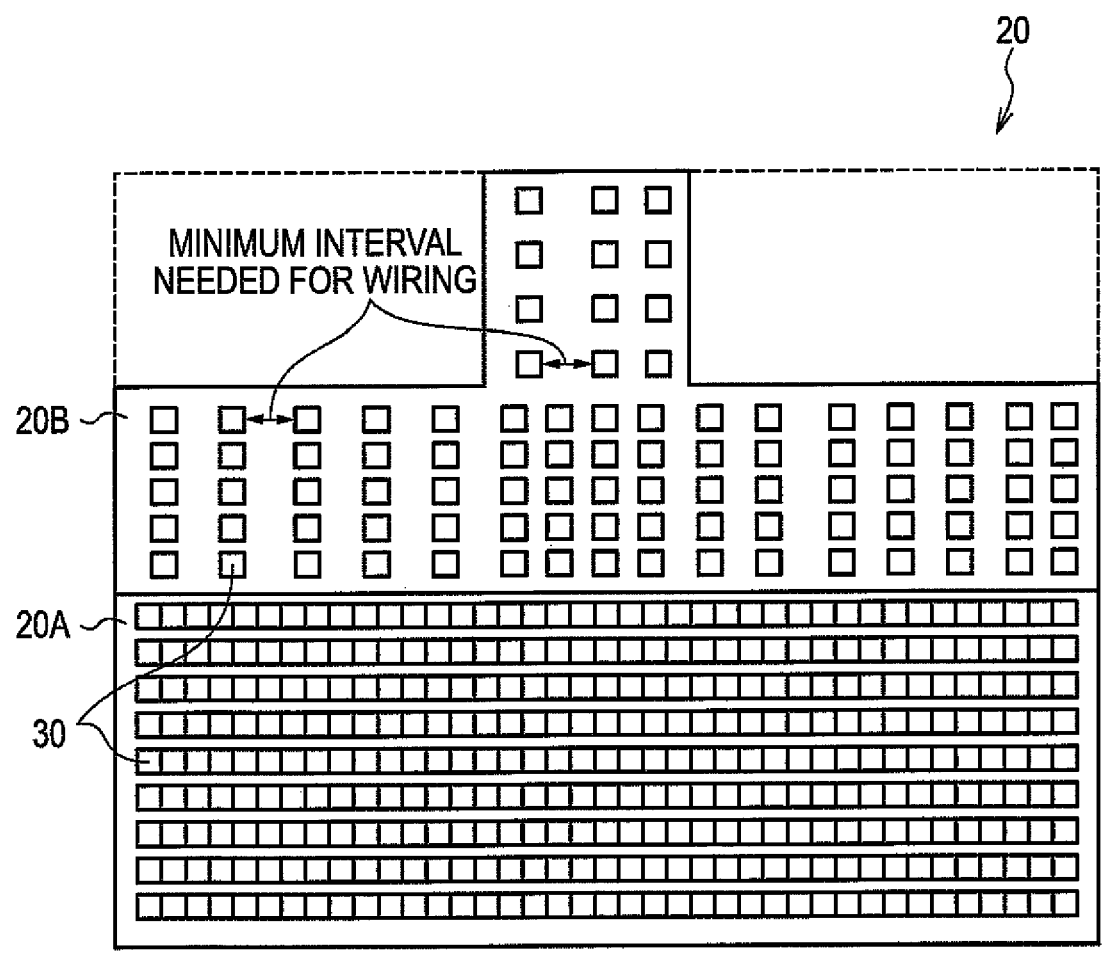
FIG. 2 is a placement diagram of basic cells at a gate array region of the first exemplary embodiment.

FIG. 2 is a placement diagram of the basic cells 30 at the gate array region 20.

At the first gate array region 20A, the plural basic cells 30 are disposed at a usual interval (e.g., adjacent to one another), and the wiring within the unit cells 40, the wiring between the respective unit cells 40 structuring the basic cells 30, and the wiring between the basic cells 30 are carried out by using all of the three wiring layers. Further, at the second gate array regions 20B, the plural basic cells 30 are disposed in a state that ensures, in the lateral direction, an interval of greater than or equal to the minimum interval needed for the vertical wiring, and the wiring within the unit cells 40, the wiring between the respective unit cells 40 structuring the basic cells 30, and the wiring between the basic cells 30 are carried out by using the first and second wiring layers.

Here, the method of fabricating the gate array mixed-loaded semiconductor memory device 10 will be described.

First, as shown in FIG. 1, memory cells are disposed in the form of an array at the memory array regions 12, 14 by using all three of the wiring layers. Concretely, memory cells are arranged in the form of an array at the first wiring layer, and these memory cells are wired by using the first through third wiring layers. Hereinafter, a group of memory cells that are arrayed at a memory array region will be called a memory array. Further, power supply wires for reading and writing of the memory arrays are disposed at the peripheries of the memory array regions 12, 14. Here, in order to efficiently supply power to the memory arrays, the power supply wiring region 16 and the VPP power supply wiring region 18 are disposed in a vicinity of the memory array regions 12, 14. Specifically, at the power supply wiring region 16, the VDD and VSS power supply wires are drawn by using the third wiring layer, and, at the VPP power supply wiring region 18, the high-voltage power supply wire for writing is drawn by using the third wiring layer. Accordingly, at the third wiring layer, the regions of the power supply wiring region 16 and the VPP power supply wiring region 18 cannot be used by other wires.

Next, the gate array region 20 is provided at the periphery of the memory array regions 12, 14. Of the gate array region 20, the regions that are below the power supply wiring region 16 and the VPP power supply wiring region 18 are made to be the second gate array regions 20B, and the other region thereof is made to be the first gate array region 20A.

Because the power supply wire and the VPP power supply wire are provided at the power supply wiring region 16 and the VPP power supply wiring region 18 of the third wiring layer, at the second gate array regions 20B that are provided therebeneath, the first and second wiring layers can be used for wiring, and the third wiring layer cannot be used. On the other hand, because the first gate array region 20A is not disposed beneath the power supply wiring region 16 and the VPP power supply wiring region 18, all of the wiring layers can be used for wiring.

The plural basic cells 30 are disposed at the gate array region 20 of the first wiring layer among the three wiring layers.

Because the third wiring layer can be used for connecting the basic cells 30 at the first gate array region 20A, the basic cells 30 are disposed at the usual interval without widening the placement interval of the basic cells 30.

At the second gate array regions 20B, as described above, the third wiring layer cannot be used for vertical wiring. Therefore, as shown in FIG. 2, the respective basic cells 30 are disposed with the interval in the lateral direction between the basic cells 30 being made to be an interval that is wider than usual, in order for the vertical wiring, that should originally be carried out at the third wiring layer, to be possible at the first wiring layer. This region where the interval is formed to be wide in this way is used for the vertical wiring that should originally be carried out at the third wiring layer. Due thereto, violations (the impossibility of circuit wiring) due to wiring congestion that is caused by the inability to utilize the third wiring layer, can be avoided.

Finally, at the first gate array region 20A, circuit wiring is carried out by using all of the wiring layers, and, at the second gate array regions 20B, circuit wiring is carried out by using the first and second wiring layers. Namely, at the second gate array regions 20B, the vertical wiring that is usually disposed at the third wiring layer is carried out by using the aforementioned region of the first wiring layer where the interval is formed to be wide. Accordingly, the interval in the lateral direction of the basic cells 30 of the second gate array regions 20B is changed in accordance with the number of vertical wires that are passed therebetween (that are disposed therebetween), and optimization is carried out within a range that can ensure the minimum interval required for those wires.

Here, a connection example of a circuit using the first gate array region 20A, and a specific connection example of a circuit using the second gate array regions 20B will be explained by using FIG. 3 through FIG. 5B.

Figure 3:
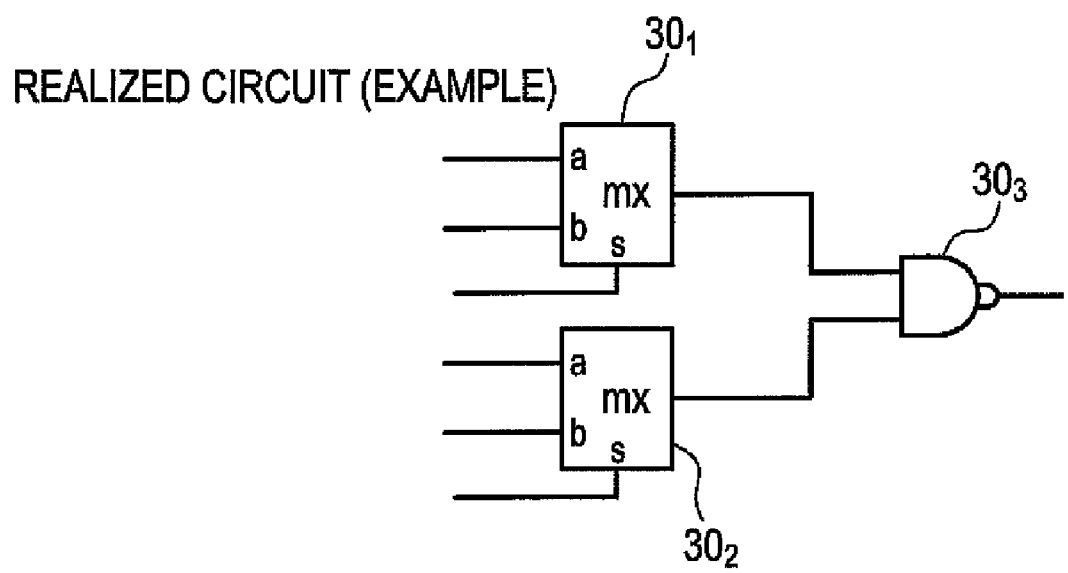
FIG. 3 is an example of a diagram of a circuit disposed at the gate array region.

FIG. 3 is an example of a circuit diagram. The circuit shown in FIG. 3 is structured by two-input, one-output multiplexers $30_1$, $30_2$ that, in accordance with the value of a selection control input s, select either of input a or input b and output it (y), and a two-input, one-output NAND circuit $30_3$ whose inputs are the respective outputs y from the two multiplexers $30_1$, $30_2$.

Figure 4A:
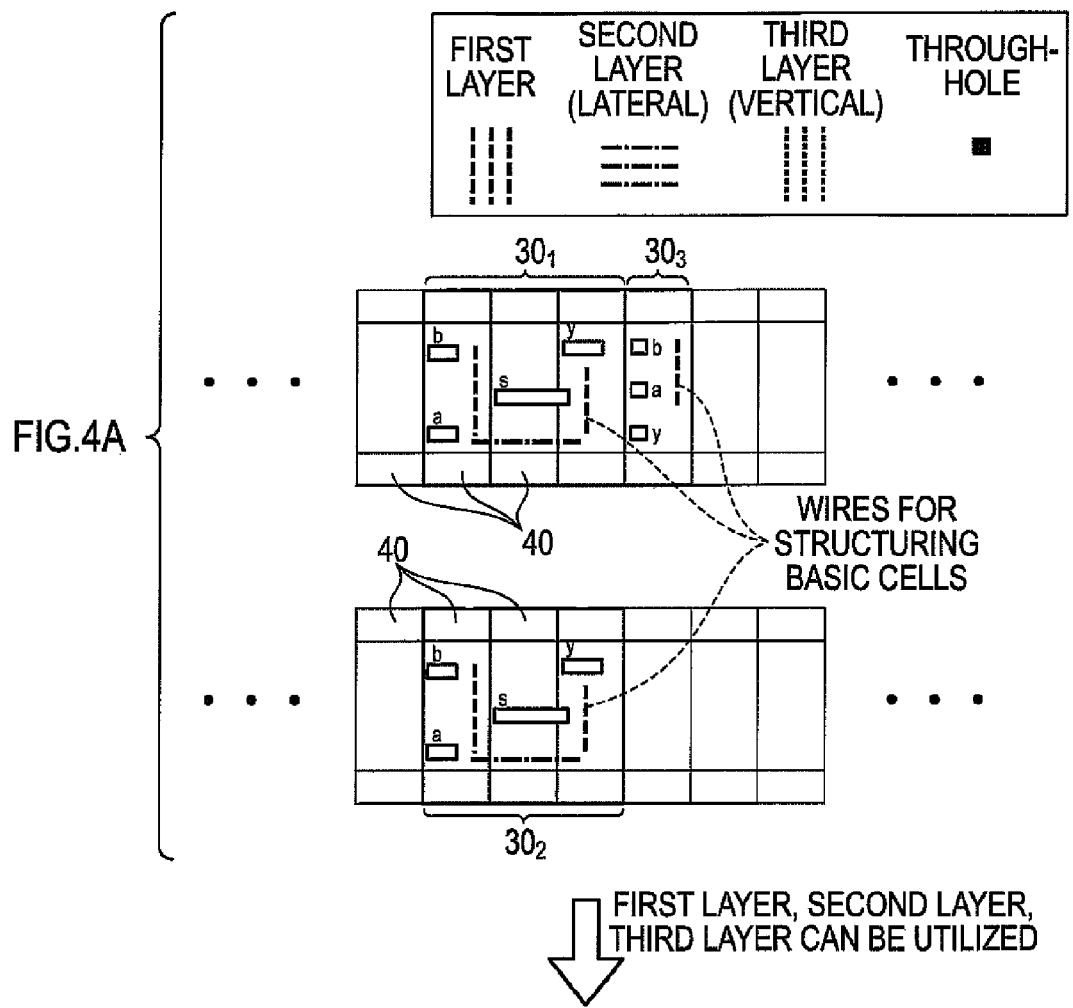
FIG. 4A and FIG. 4B are drawings showing an example of placement of basic cells when the circuit shown in FIG. 3 is formed at a first gate array region.
Figure 4B:
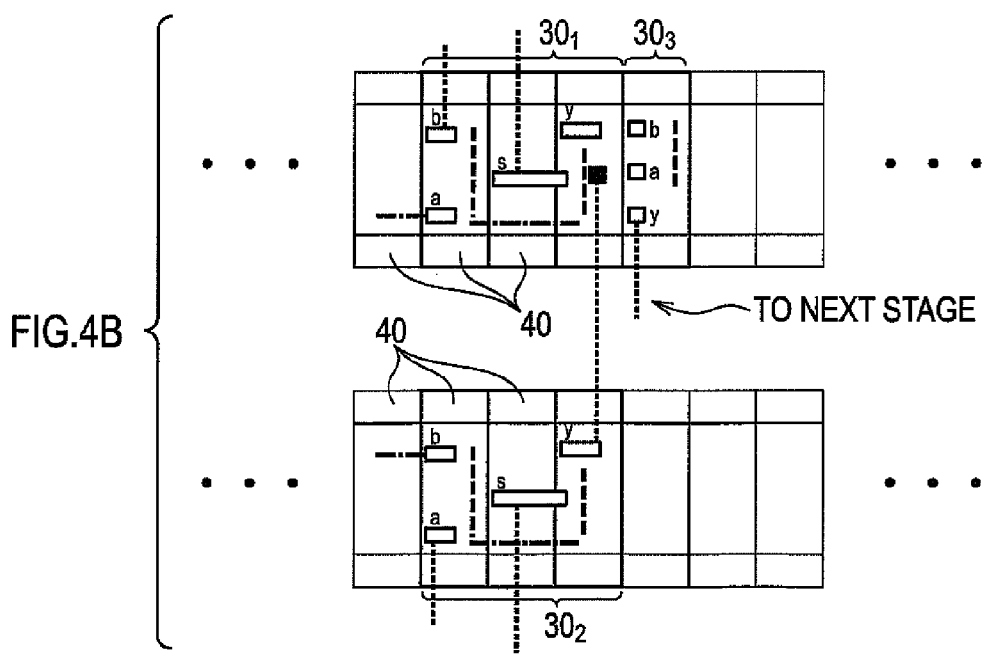

FIG. 4A and FIG. 4B are drawings showing an example of arrangement of the basic cells 30 when the circuit shown in FIG. 3 is formed at the first gate array region 20A.

First, as shown in FIG. 4A, terminals that are needed in order to structure three of the basic cells 30, i.e., the multiplexers $30_1$, $30_2$ and the NAND circuit $30_3$ respectively, are provided at the respective unit cells 40 that are arrayed at the first wiring layer.

Each of the multiplexers $30_1$, $30_2$ is structured by three of the unit cells 40 that are the unit cell 40 at which input terminals a, b are provided, the unit cell 40 at which a selection control input terminal s is provided, and the unit cell 40 at which an output terminal y is provided.

Further, the NAND circuit $30_3$ is structured by one of the unit cells 40 at which the two input terminals a, b and the one output terminal y are provided.

Next, wiring for structuring the multiplexers $30_1$, $30_2$ and the NAND circuit $30_3$ respectively is carried out. As shown in FIG. 4A, wiring is carried out by the vertical wires using the first wiring layer and the lateral wires using the second wiring layer among the three wiring layers.

Then, the respective basic cells 30 of the multiplexers $30_1$, $30_2$ and the NAND circuit $30_3$ are connected. At the first gate array 20A, all of the three wiring layers can be used. Therefore, as shown in FIG. 4B, wiring can be carried out without widening the interval in the lateral direction of the respective basic cells $30_1$, $30_2$, $30_3$.

FIG. 5A and FIG. 5B are drawings showing an example of arrangement of the basic cells 30 when the circuit shown in FIG. 3 is formed at the second gate array region 20B.

First, as shown in FIG. 5A, terminals that are needed in order to structure the multiplexers $30_1$, $30_2$ and the NAND circuit $30_3$ respectively are provided at the respective unit cells 40 that are arrayed at the first wiring layer. Next, wiring for structuring the multiplexers $30_1$, $30_2$ and the NAND circuit $30_3$ respectively is carried out. Note that the arrangement of the terminals at the respective unit cells 40 and the state of the wiring within the respective basic cells 30 are the same as in FIG. 4A.

However, at the second gate array regions 20B, the interval in the lateral direction between adjacent basic cells 30 is made to be an interval that is wider than usual, in order to be able to utilize the first wiring layer for vertical wiring instead of the third wiring layer that cannot be used for wiring. Hereinafter, the regions that are formed by widening the interval in the lateral direction in this way are called between-cell regions. In the example shown in FIG. 5A, between-cell regions A1 through A5 are formed.

Next, the respective basic cells 30 of the multiplexers $30_1$, $30_2$ and the NAND circuit $30_3$ are connected. Note that, at the first gate array region 20A, as shown in FIG. 4B, the vertical wiring can be placed directly by using the third wiring layer at the input terminals b and the selection control input terminals s of the multiplexers $30_1$, $30_2$ and the input terminal a and the output terminal y of the NAND circuit $30_3$. However, at the second gate array regions 20B, because the third wiring layer cannot be utilized, these vertical wires are placed as follows.

The lateral wires are drawn by using the second wiring layer, from the respective terminals to the between-cell regions formed in vicinities of the respective terminals. Next, by using the first wiring layer, the vertical wires are drawn from the between-cell region side end portions of these lateral wires. The vertical wires of the first layer and the lateral wires of the second layer are connected via through-holes.

Accordingly, for the interval in the lateral direction of the respective basic cells, an interval that is greater than or equal to the minimum interval needed for wiring must be ensured in accordance with the number of vertical wires that are passed therebetween.

For example, three vertical wires are placed between each of the multiplexers $30_1$, $30_2$ and the basic cell 30 at the left side thereof. Therefore, the interval needed for at least three vertical wires must be ensured thereat. Further, because one vertical wire is placed between the multiplexer $30_1$ and the NAND circuit $30_3$, the interval needed for at least one vertical wire must be ensured thereat.

As described above, in accordance with the first exemplary embodiment, the regions below the power supply wiring and the VPP power supply wiring that are usually dead space can also be utilized as effective regions by disposing the basic cells at an interval that is wider than usual and mitigating wiring congestion.

As a result, without forming numerous wiring layers, the surface areas of the chips can be decreased and the number obtained per wafer can be increased, thereby enabling a reduction in fabrication costs and an improvement in yield.

Note that the present exemplary embodiment describes an example in which the interval in the lateral direction of plural basic cells is widened at the second gate array regions 20B. However, depending on the circuits that are to be placed at the second gate array region, the interval may be widened in units of the unit cells rather than the interval being widened in units of the basic cells. Namely, the interval in the lateral direction between unit cells may be widened. Effects that are the same as those described above are achieved by this structure as well.

Second Exemplary Embodiment

Figure 6:
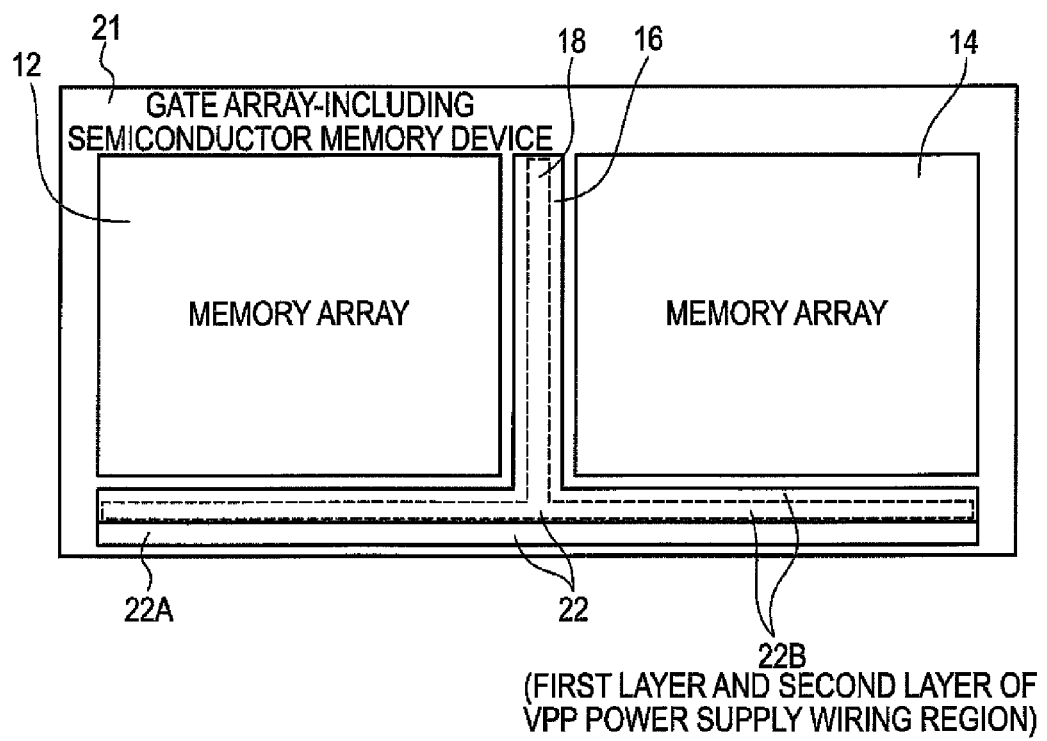
FIG. 6 is a structural drawing of a gate array mixed-loaded semiconductor memory device of a second exemplary embodiment.

FIG. 6 is a structural drawing of a gate array mixed-loaded semiconductor memory device 21 of the present exemplary embodiment.

The gate array mixed-loaded semiconductor memory device 21 is structured by the two memory array regions 12, 14 at which memory arrays are arrayed, the power supply wiring region (VDD, VSS) 16, the VPP power supply wiring region 18, and a gate array region 22 at which the plural basic cells 30 are arrayed. In the same way as in the first exemplary embodiment, the gate array mixed-loaded semiconductor memory device 21 as well is structured by three wiring layers, and, among the three wiring layers, the first layer is used as a wiring layer for vertical wiring, the second layer is used as a wiring layer for lateral wiring, and the third layer is used as a wiring layer for vertical wiring. Note that, although the first layer is a wiring layer for vertical wiring, in connecting within the unit cell 40, there are also cases in which lateral wiring is disposed at the first wiring layer. Here, portions in FIG. 5A and FIG. 5B that are the same as or equivalent to those of FIG. 1 are denoted by the same reference numerals, and description thereof is omitted.

The gate array region 22 of the present exemplary embodiment also is structured from a first gate array region 22A at which all three of the wiring layers can be utilized, and a second gate array region 22B at which the first and second wiring layers can be utilized. However, in the present exemplary embodiment, the second gate array region 22B is disposed only at the region beneath the VPP power supply wiring region 18.

Figure 7:
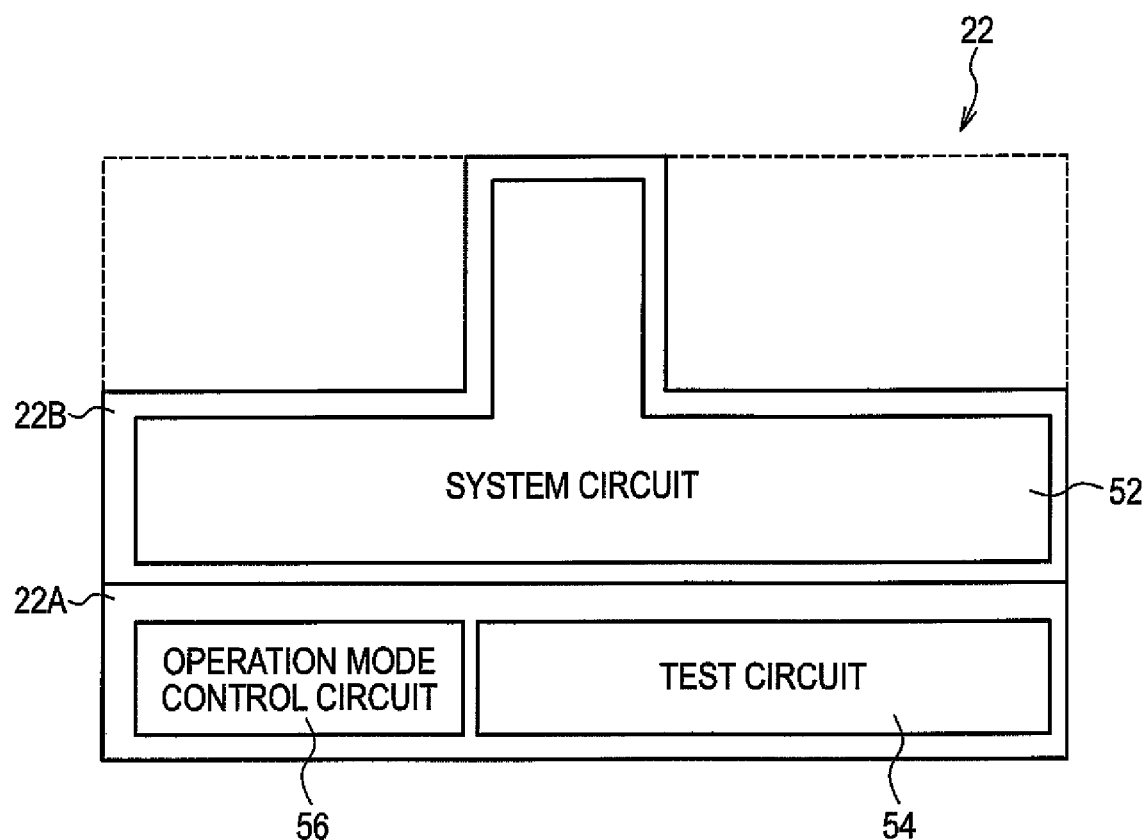
FIG. 7 is an example of circuit blocks disposed at a gate array region of the second exemplary embodiment.

FIG. 7 is an example of circuit blocks disposed at the gate array region 22. As shown in FIG. 7, a system circuit 52, that only supports reading operation (VPP=GND) with respect to the memory array, is disposed at the second gate array region 22B. A test circuit 54, that supports both writing operation (VPP=high voltage HV) and reading operation (VPP=GND) with respect to the memory array, and an operation mode control circuit 56, that switches between operation by the system circuit 52 and operation by the test circuit 54, are disposed at the first gate array region 22A.

Here, the method of fabricating the gate array mixed-loaded semiconductor memory device 21 will be described.

First, after forming the memory array regions 12, 14, the gate array region 22 is formed. Here, as shown in FIG. 6, the second gate array region 22B of the gate array region 22 is formed beneath the VPP power supply wiring region 18. Here, the VPP power supply wire that is disposed at the VPP power supply wiring region 18 is a power supply that is high voltage (HV) at the time of writing to the memory array, and is GND at the time of reading.

Next, as shown in FIG. 7, the respective circuit blocks of the gate array region 22 are disposed. Namely, the test circuit 54 that supports both writing operation and reading operation with respect to the memory array, and the operation mode control circuit 56 that switches the gate array mixed-loaded semiconductor memory device 21 between operation by the system circuit 52 and operation by the test circuit 54, are disposed at the first gate array region 22A, and the system circuit 52 that only supports reading operation with respect to the memory array is disposed at the second gate array region 22B. In the same way as in the first exemplary embodiment, at the second gate array region 22B, wiring congestion is mitigated by placing the basic cells 30 at an interval wider than usual.

Namely, a circuit, that does not operate when the VPP power supply is HV and operates only when the VPP power supply is GND, is disposed at the second gate array region 22B. On the other hand, a circuit, that operates both when the VPP power supply is HV and GND is disposed at the first gate array region 22A, but a circuit that operates at only either one time may be provided.

Finally, in the same way as in the first exemplary embodiment, at the first gate array region 22A, circuit wiring is carried out by using all of the wiring layers, and, at the second gate array region 22B, circuit wiring is carried out by using the first and second wiring layers.

By disposing the gate array region beneath the power supply wiring region or beneath the VPP power supply wiring region, there are cases in which malfunctioning due to the effects of power supply noise are of concern. However, as described above, in the present exemplary embodiment, a circuit, that does not operate when the VPP power supply is high voltage (HV) and operates only when the VPP power supply is GND, is separated and disposed beneath the VPP power supply wiring region. Therefore, malfunctioning due to the effects of power supply noise are avoided, and this region can be utilized effectively.

Another Modified Example

Note that the present invention is not limited to the above-described exemplary embodiments, and various changes in terms of design can be made thereto.

Figure 8:
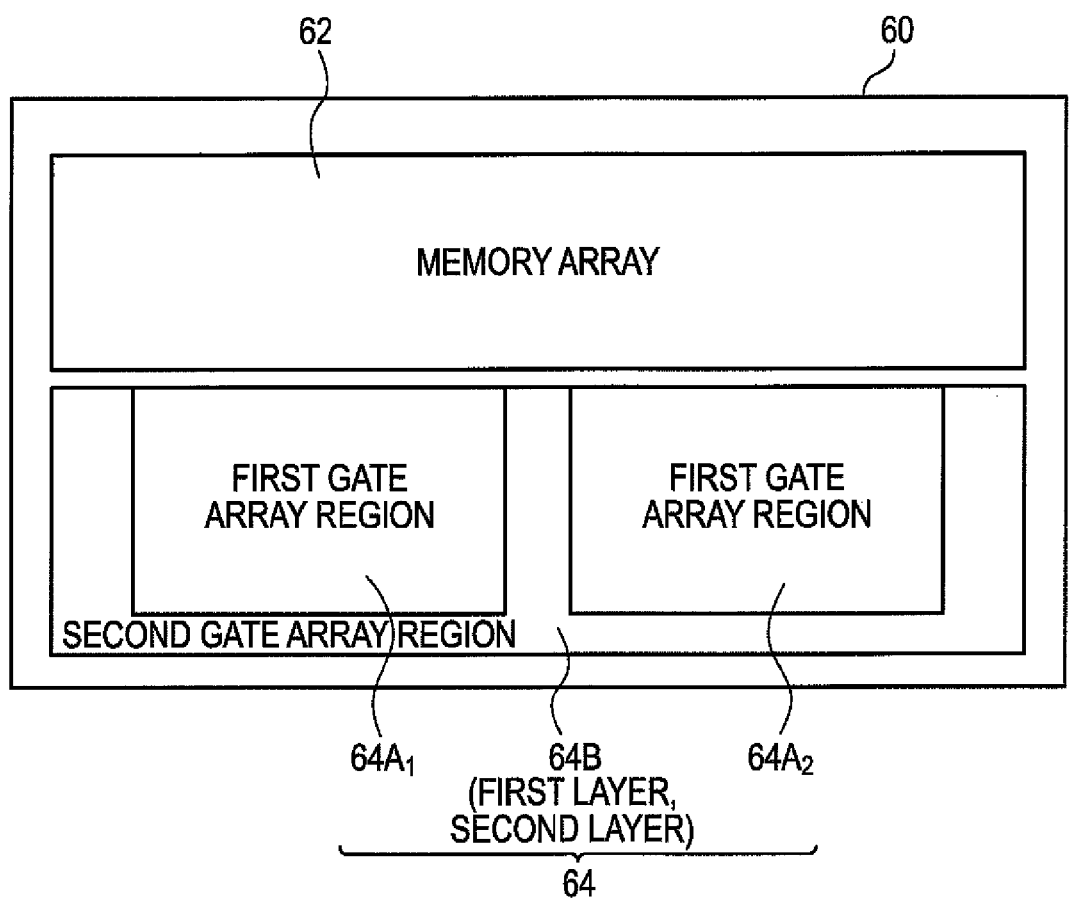
FIG. 8 is a modified example of a structural drawing of the gate array mixed-loaded semiconductor memory device.

For example, examples of the chip layouts are not limited to the examples shown in FIG. 1 and FIG. 6, and may be, for example, the layout shown in FIG. 8. A gate array mixed-loaded semiconductor memory device 60 shown in FIG. 8 is structured such that a memory array region 62, at which a memory array is provided, and a gate array region 64 are disposed. Note that, although not illustrated, the power supply wiring region and the VPP power supply wiring region are formed at the third wiring layer.

The gate array region 64 is structured from two first gate array regions 64A$_1$, 64A$_2$ at which all three of the wiring layers can be utilized, and a second gate array region 64B that is formed at the region below the power supply wiring region and the VPP power supply wiring region and at which the first and second wiring layers can be used.

Effects that are the same as those of the above-described exemplary embodiments can be achieved by this structure as well.

Further, the first and second exemplary embodiments describe methods of effectively using the region below the power supply wiring and the VPP power supply wiring, but the present invention is not limited to the same. For example, if the third wiring layer is used as a region for placement of the product name of the chip or the like and the remaining wiring layer is dead space, the second gate array region can be formed at that region and can be effectively used by the same method as described above.

Moreover, the second exemplary embodiment describes, as an example, a layout in which the test circuit 54 and the operation mode control circuit 56 are disposed at the first gate array region 22A and the system circuit 52 is disposed at the second gate array region 22B. However, the present invention is not limited to the same. Provided that the circuit disposed beneath the VPP power supply wiring region is a circuit that operates only when the VPP power supply is GND, the circuits and layout are not limited to those exemplified in the second exemplary embodiment.

The first and second exemplary embodiments describe, as examples, gate array mixed-loaded semiconductor memory devices that are structured by using, among the three wiring layers, the first layer as a wiring layer for vertical wiring, the second layer as a wiring layer for lateral wiring, and the third layer as a wiring layer for vertical wiring. However, the present invention is not limited to the same.

For example, the present invention may be applied to a gate array mixed-loaded semiconductor memory device that is structured by using, among the three wiring layers, the first layer as a wiring layer for lateral wiring (also including cases in which vertical wires are disposed at the first layer in addition to lateral wires in connecting within the unit cells 40), the second layer as a wiring layer for vertical wiring, and the third layer as a wiring layer for lateral wiring. In this case, when the basic cells are arrayed at the second gate array region at which the third wiring layer cannot be utilized and the first and second wiring layers can be utilized, the interval in the vertical direction between the basic cells is disposed at an interval that is wider than usual. Namely, the interval in the vertical direction between adjacent basic cells is made to be an interval that is wider than usual, in order to be able to carry out, by using the first wiring layer, lateral wiring that is usually carried out by using the third wiring layer. This interval is changed in accordance with the number of lateral wires that are to be passed therebetween, and optimization is carried out within a range that can ensure the minimum interval required for the wires.

What is claimed is:

1. A semiconductor memory device comprising:
a first wiring layer for carrying out wiring in at least a first direction;
a second wiring layer that is layered on the first wiring layer and is for carrying out wiring in a second direction intersecting the first direction;
a third wiring layer that is layered on the second wiring layer and is for carrying out wiring in the first direction;
a memory array region at which a plurality of memory cells are formed so as to be arrayed at the first wiring layer, the memory array region being formed at a region at which the first wiring layer, the second wiring layer and the third wiring layer can be used in wiring of the plurality of memory cells;
a first gate array region at which a plurality of unit cells are formed so as to be arrayed at the first wiring layer, the first gate array region being formed at a region at which the first wiring layer, the second wiring layer and the third wiring layer can be used in wiring of the plurality of unit cells; and
a second gate array region at which a plurality of unit cells are formed so as to be arrayed at the first wiring layer, the second gate array region being formed at a region at which two wiring layers that are the first wiring layer and the second wiring layer can be used in wiring of the plurality of memory cells, and the plurality of unit cells are arrayed so as to be separated at an interval needed for placement, by using the first wiring layer, of wiring that should be placed by using the third wiring layer.

2. The semiconductor memory device of claim 1, wherein
a power supply wiring region, at which is disposed power supply wiring that supplies power supply voltage to the memory cells, is formed at the third wiring layer, and
the second gate array region is formed at a region below the power supply wiring region.

3. The semiconductor memory device of claim 1, wherein
a first power supply wiring region, at which is disposed first power supply wiring that supplies first power supply voltage to the memory cells, and a second power supply wiring region, at which is disposed second power supply wiring that supplies second power supply voltage that is higher than ground voltage at times of writing the memory cells and supplies ground voltage at times of reading, are formed at the third wiring layer,
the second gate array region is formed below the second power supply wiring region, and
a circuit, that does not operate when the second power supply wiring supplies the second power supply voltage and operates when the second power supply wiring supplies ground voltage, is formed at the second gate array region.

4. A semiconductor memory device comprising:
a first wiring layer for carrying out wiring in at least a first direction;
a second wiring layer that is layered on the first wiring layer and is for carrying out wiring in a second direction intersecting the first direction;
a third wiring layer that is layered on the second wiring layer and is for carrying out wiring in the first direction;
a memory array region at which a plurality of memory cells are formed so as to be arrayed at the first wiring layer, the memory array region being formed at a region at which the first wiring layer, the second wiring layer and the third wiring layer can be used in wiring of the plurality of memory cells;

a first gate array region at which a plurality of basic cells that are structured by a plurality of unit cells are formed so as to be arrayed at the first wiring layer, the first gate array region being formed at a region at which the first wiring layer, the second wiring layer and the third wiring layer can be used in wiring of the plurality of basic cells and the unit cells that structure the plurality of basic cells; and a second gate array region at which a plurality of basic cells that are structured by a plurality of unit cells are formed so as to be arrayed at the first wiring layer, the second gate array region being formed at a region at which two wiring layers that are the first wiring layer and the second wiring layer can be used in wiring of the plurality of basic cells and the unit cells that structure the plurality of basic cells, and the plurality of basic cells are arrayed so as to be separated at an interval needed for placement, by using the first wiring layer, of wiring that should be placed by using the third wiring layer.

5. The semiconductor memory device of claim 4, wherein
a power supply wiring region, at which is disposed power supply wiring that supplies power supply voltage to the memory cells, is formed at the third wiring layer, and,
the second gate array region is formed at a region below the power supply wiring region.

6. The semiconductor memory device of claim 4, wherein
a first power supply wiring region, at which is disposed first power supply wiring that supplies first power supply voltage to the memory cells, and a second power supply wiring region, at which is disposed second power supply wiring that supplies second power supply voltage that is higher than ground voltage at times of writing the memory cells and supplies ground voltage at times of reading, are formed at the third wiring layer,
the second gate array region is formed below the second power supply wiring region, and
a circuit, that does not operate when the second power supply wiring supplies the second power supply voltage and operates when the second power supply wiring supplies ground voltage, is formed at the second gate array region.

* * * * *